United States Patent
Nandakumar et al.

(10) Patent No.: US 12,015,057 B2
(45) Date of Patent: Jun. 18, 2024

(54) CARBON, NITROGEN AND/OR FLUORINE CO-IMPLANTS FOR LOW RESISTANCE TRANSISTORS

(71) Applicant: Texas Instruments Incorporated, Dallas, TX (US)

(72) Inventors: Mahalingam Nandakumar, Richardson, TX (US); Alexei Sadovnikov, Sunnyvale, CA (US); Henry Litzmann Edwards, Garland, TX (US); Jarvis Benjamin Jacobs, Murphy (IN)

(73) Assignee: Texas Instruments Incorporated, Dallas, TX (US)

( * ) Notice: Subject to any disclaimer, the term of this patent is extended or adjusted under 35 U.S.C. 154(b) by 293 days.

(21) Appl. No.: 17/156,612

(22) Filed: Jan. 24, 2021

(65) Prior Publication Data
US 2022/0208973 A1     Jun. 30, 2022

Related U.S. Application Data

(60) Provisional application No. 63/132,859, filed on Dec. 31, 2020.

(51) Int. Cl.
| | |
|---|---|
| *H01L 29/78* | (2006.01) |
| *H01L 21/8238* | (2006.01) |
| *H01L 27/092* | (2006.01) |
| *H01L 29/26* | (2006.01) |
| *H01L 29/66* | (2006.01) |

(52) U.S. Cl.
CPC ...... *H01L 29/26* (2013.01); *H01L 21/823892* (2013.01); *H01L 27/092* (2013.01); *H01L 29/66659* (2013.01); *H01L 29/66681* (2013.01); *H01L 29/7816* (2013.01); *H01L 29/7835* (2013.01)

(58) Field of Classification Search
CPC ... H01L 29/7816; H01L 29/26; H01L 27/092; H01L 29/66659; H01L 29/66681
See application file for complete search history.

(56) References Cited

U.S. PATENT DOCUMENTS

| | | | | |
|---|---|---|---|---|
| 2009/0068804 | A1* | 3/2009 | Pendharkar | H01L 29/0878 |
| | | | | 257/E21.421 |
| 2015/0279468 | A1* | 10/2015 | Lee | G11C 16/0491 |
| | | | | 257/314 |
| 2019/0140079 | A1* | 5/2019 | Tan | H01L 29/105 |
| 2019/0363187 | A1* | 11/2019 | You | H01L 29/1095 |

* cited by examiner

*Primary Examiner* — Tucker J Wright
(74) *Attorney, Agent, or Firm* — Andrew R. Ralston; Frank D. Cimino

(57) ABSTRACT

A semiconductor device including drain extended metal oxide semiconductor field effect transistor (MOSFET) includes a source region and a drain region each having a first dopant type spaced apart along a surface of a semiconductor material having a second opposite conductivity type. A gate electrode over the semiconductor material surface between the source region and the drain region. A diffusion suppression implant region in the semiconductor material extends from the source region under the gate electrode. The diffusion suppression implant region includes a body region having the second opposite conductivity type and comprises at least one of carbon, nitrogen, and fluorine.

17 Claims, 4 Drawing Sheets

CARBON, NITROGEN AND/OR FLUORINE CO-IMPLANTS FOR LOW RESISTANCE TRANSISTORS

CROSS-REFERENCE TO RELATED APPLICATIONS

This application claims the benefit of priority under 35 U.S.C. § 119(e) of U.S. Provisional Application No. 63/132,859 (Texas Instruments docket number T91059US01), filed Dec. 31, 2020, which is hereby incorporated by reference in its entirety.

FIELD

This disclosure relates to the field of semiconductor devices. More particularly, but not exclusively, this disclosure relates to reducing resistance of transistors in semiconductor devices.

BACKGROUND

Metal oxide semiconductor (MOS) transistors with extended drain regions are commonly used in power semiconductor devices. As power semiconductor devices such as DC-DC converters are scaled, key metrics, such as lower source-to-drain resistance Rsd, off-state current Ioff, and threshold voltage Vt, are in need of improvement. Methods are needed to simultaneously achieve both scaling and performance improvement.

SUMMARY

This summary is provided to introduce a brief selection of disclosed concepts in a simplified form that are further described below in the detailed description including the drawings provided. This summary is not intended to limit the claimed subject matter's scope.

Some disclosed examples include semiconductor devices including a drain extended metal oxide semiconductor field effect transistor (DE-MOSFET) and associated process flow including at least one of carbon, nitrogen, and fluorine co-implants in an underlying well.

In one example, a semiconductor device includes a source region and a drain region each having a first dopant type spaced apart along a surface of a semiconductor material having a second opposite conductivity type. A gate electrode over the semiconductor material surface between the source region and the drain region. A diffusion suppression implant region in the semiconductor material extends from the source region under the gate electrode. The diffusion suppression implant region includes a body region having the second opposite conductivity type and comprises at least one of carbon, nitrogen, and fluorine.

In another example, a method of forming a semiconductor device includes forming a drain drift region in a semiconductor material, the drain drift region having a first conductivity type. A body region is formed in the semiconductor material, the body region having a second, opposite, conductivity type. A source region is formed in the body region, the source region having the first conductivity type. A gate electrode is formed over the semiconductor material between the drain drift region and the source region, the gate electrode extending partway over the body. At least one of carbon, nitrogen, and fluorine is implanted into the body region.

DETAILED DESCRIPTION

Figure 1:
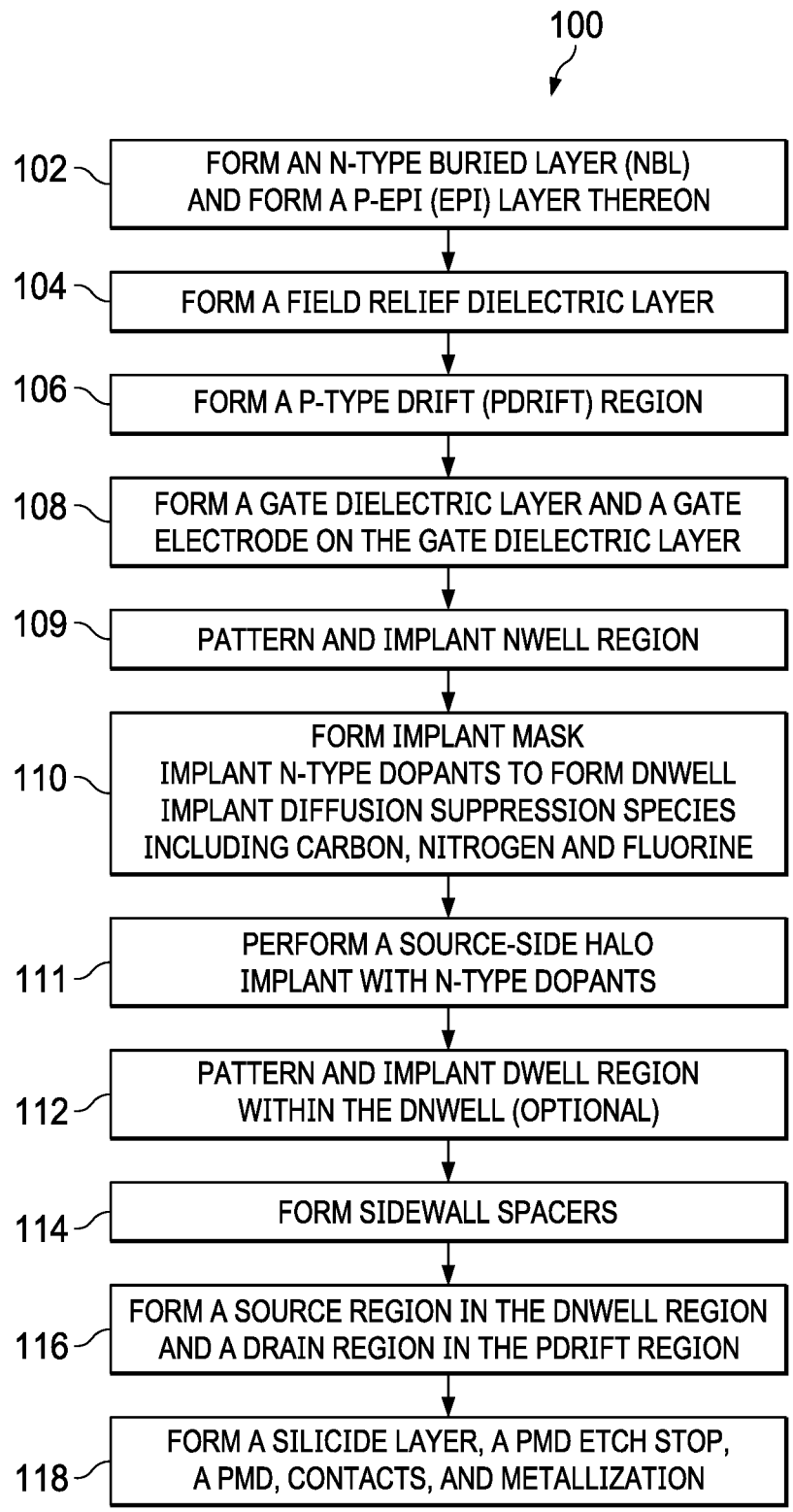
FIG. 1 is an example method of forming a high voltage PLDMOS transistor.

The present disclosure is described with reference to the attached figures. The figures may not be drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In this disclosure and the claims that follow, unless stated otherwise and/or specified to the contrary, any one or more of the layers set forth herein may be formed in any number of suitable ways, such as with spin-on techniques, sputtering techniques (e.g., magnetron and/or ion beam sputtering), thermal growth techniques or deposition techniques such as chemical vapor deposition (CVD), physical vapor deposition (PVD), PECVD, or atomic layer deposition (ALD), for example. As another example, silicon nitride may be a silicon-rich silicon nitride or an oxygen-rich silicon nitride. Silicon nitride may contain some oxygen, but not so much that the materials dielectric constant is substantially different from that of high purity stoichiometric silicon nitride.

It is noted that terms such as top, bottom, and under may be used in this disclosure. These terms should not be construed as limiting the position or orientation of a structure or element, but should be used to provide spatial relationship between structures or elements.

Drain extended transistors may include drain-extended NMOS (DENMOS), drain-extended PMOS (DEPMOS), and/or p-channel and n-channel laterally diffused metal oxide semiconductor (PLDMOS or NLDMOS) transistors, as well as groups of DENMOS and DEPMOS, referred to as complimentary drain extended MOS or DECMOS transistors. Described examples include doped regions of various semiconductor structures which may be characterized as p-doped and/or n-doped regions or portions, and include regions that have majority carrier dopants of a particular type, such as n-type dopants or p-type dopants. Although an example high voltage p-channel PLDMOS transistor 200 and an example low voltage PLDMOS transistor 400 are described herein, one skilled in the pertinent art will easily recognize that high voltage n-channel NLDMOS transistors analogous to the PLDMOS transistor 200 and low voltage n-channel NLDMOS transistors analogous to the PLDMOS transistor 400 can be formed by substituting p-doped regions with n-doped regions and n-doped regions with p-doped regions.

Semiconductor devices with drain extended transistors may include several of various doped regions of semiconductor material, some listed here for convenience. The various regions are described without implied limitation for the purpose of discussion in the context of the present disclosure. An n-type buried layer (NBL), if implemented, is an n-type region that may have a p-type semiconductor material over the NBL. A p-type buried layer (PBL), if implemented, is a p-type region that may have an n-type semiconductor material over the PBL. A buried layer (BL) may be formed by an ion implant of dopants of the appropriate conductivity type, followed by one or more anneal or thermal drive processes, followed by epitaxial growth of a semiconductor material of n-type or p-type over the BL. A deep region may be an n-type region (DEEPN) or a p-type (DEEPP) extending from a top surface of a semiconductor material to the BL. The DEEPN or DEEPP region may be formed by an ion implant of appropriately typed dopants. As used herein, a shallow well (SW), n-type (SNW) or p-type (PNW), is a well extending from the surface of the semiconductor material to a depth that is less than 2 microns. The shallow well may be formed by an ion implant of n-type or p-type dopants. A buried isolation (BISO) region may be an n-type region extending from the SNW to an NBL or a p-type region extending from a SPW. The BISO region is formed by a BISO ion implant of n-type or p-type dopants. As used herein a diffused well (DWELL) is a first well of one conductivity type with a shallow second well of the opposite conductivity type formed within the first well. For example the DWELL may be a boron-doped p-type well with a shallow arsenic doped n-type well in the p-type well. In this example DWELL, a DWELL ion implant includes boron and arsenic, and is followed by a thermal drive to diffuse the boron laterally and vertically further than the arsenic. The boron-doped p-type well of the DWELL may provide a body for an NLDMOS transistor, while the arsenic doped n-type well of the DWELL may provide a source extension for the NLDMOS transistor. The arsenic doped n-type well of the DWELL may provide a channel limit region abutting a source extension in a PLDMOS transistor. An n-type drift (NDRIFT) region is an n-type region of a n-channel MOSFET, extending laterally between a drain and a channel region of the n-channel MOSFET. The NDRIFT region is formed by an NDRIFT ion implant of n-type dopants, including phosphorus. A deep n-type well (DNWELL) is an n-type well that may provide a body for a DEPMOS transistor. The DNWELL is formed by a DNWELL ion implant of phosphorus. A p-type drift (PDRIFT) region is a p-type region of a p-channel MOSFET, extending laterally between a drain and a channel region of the p-channel MOSFET. The PDRIFT region is formed by a PDRIFT ion implant of p-type dopants, including boron.

Figure 2:
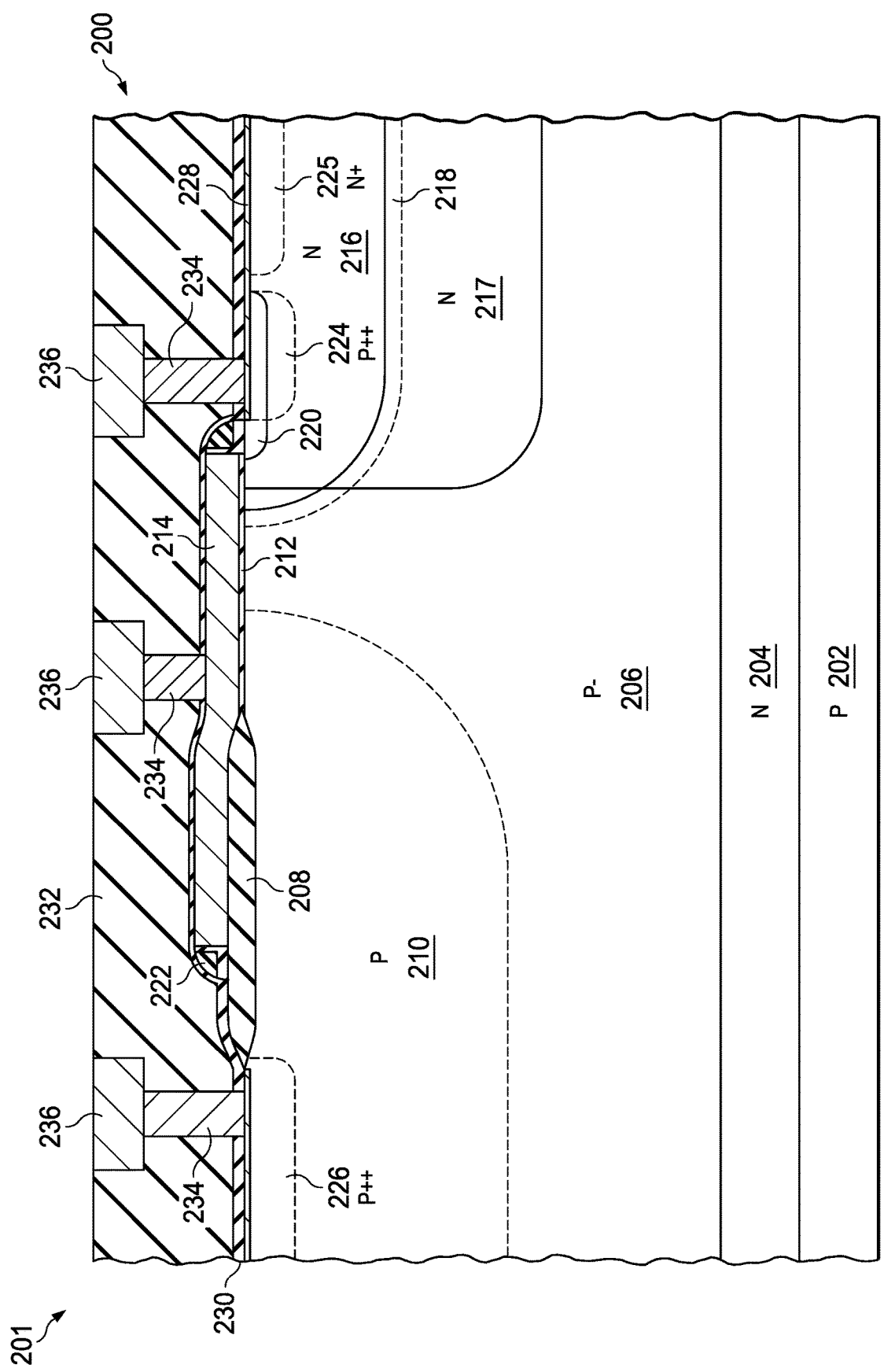
FIG. 2 is a cross section of a high voltage PLDMOS transistor such as produced by the method of FIG. 1.

FIG. 1 is a flow chart that shows some steps of forming a high voltage PLDMOS transistor in an example method 100. FIG. 2 is a cross-sectional diagram showing an example of a semiconductor device 201 having a high voltage PLDMOS transistor 200 of formed according to the principles of the method 100. FIGS. 1 and 2 are referred to concurrently in the following discussion.

Step 102 includes providing a substrate 202 having an epitaxial (EPI) layer 206 of a semiconductor material thereon. The EPI layer 206 may be about 15 microns to 40 microns thick by way of example. The process may include forming on the substrate 202 a first EPI layer (not explicitly shown), forming an NBL 204, and then forming over the NBL 204 a second EPI layer 206 that may be lightly-doped p-type silicon. The NBL 204 may be heavily doped, with an average dopant concentration above $1 \times 10^{19}$ cm$^{-3}$, for example. The NBL 204 may have a blanket configuration, extending across the semiconductor device 201, or may be patterned. The substrate 202 is generally a p-type substrate, typically boron doped from $1 \times 10^{16}$ to $1 \times 10^{19}$ cm$^{-3}$, and the EPI layer 206 may have a doping level from $3 \times 10^{14}$ cm$^{-3}$ to $3 \times 10^{16}$ cm$^{-3}$ by way of example. The substrate 202 and the EPI layer 206 may both include silicon, and may also include other semiconductor materials.

Disclosed drain extended transistors may include an isolation structure (not specifically shown). The isolation structure may have a deep trench (DT) with an optional dielectric liner, extending to the NBL. The isolation structure may have an outer n-type tank, which may be formed in several ways, extending to the NBL. The outer n-type tank may include a DEEPN region extending to the NBL 204. The outer n-type tank may include a DWELL extending to the NBL 204. The outer n-type tank may include an SNW and a BISO region extending from the SNW to the NBL 204. The BISO region, if present, may be produced by a BISO ion implant of phosphorus performed before a second EPI process (in a two-EPI process) at the edges of the NBL 204 (but after an NBL furnace drive which diffuses the NBL 204 deeper into the substrate 202). The implanted phosphorus diffuses up into the second EPI, enabling an n-tank connection to be established with the SNW for example (hence avoiding the use of a DEEPN region, which is sometimes desirable). In all of these cases, the NBL 204 forms the bottom of the isolation structure, and the other isolation element (the DT, the DEEPN region, or the SNW combined with the BISO region) forms vertical walls of the isolation structure that extend up to the top semiconductor surface.

Step 104 includes forming a field relief dielectric layer 208. In a series of steps not specifically shown, a pad oxide layer of silicon dioxide may be formed on the EPI layer 206 surface. The pad oxide layer may include silicon dioxide that is formed by a thermal oxidation process or a CVD process. The pad oxide layer provides stress relief between the EPI layer 206 and subsequent layers. The pad oxide layer may be five nanometers to 50 nanometers thick, by way of example. A silicon nitride layer is then deposited and an etch mask is deposited. The etch mask serves the function of masking the silicon nitride layer and it may include a light-sensitive organic material that is coated, exposed and developed to expose the silicon nitride layer at desired locations. A plasma etch process removes the exposed silicon nitride and exposes the pad oxide layer in a region at which the field relief dielectric layer 208 is to be formed. After a furnace oxidation to form the field relief dielectric layer 208, a subsequent wet chemical process removes the silicon nitride layer. While FIG. 2 shows a local oxidation of silicon (LOCOS) layer of silicon dioxide as the field relief dielectric layer 208 with tapered edges (bird's beaks), other examples may use a shallow trench isolation (STI) layer of silicon dioxide or a thick dual gate oxide process. In an example STI process, a trench is formed, then a blanket layer of silicon dioxide may be deposited on the wafer and the overburden of dielectric outside of the trench areas may be removed using a chemical mechanical planarization (CMP) step. An example thick dual-gate process may form a layer of silicon dioxide 50 nanometers to 200 nanometers thick, by forming a first gate oxide, patterning and leaving photoresist on field oxide stress relief areas and removing first gate oxide from other areas of the wafer by means of a wet or dry chemical etch process and forming a second thinner gate oxide region over the epitaxial layer during the second gate oxidation step. The dual gate oxide process may also be used to produce the field relief dielectric layer.

In step 106 a PDRIFT region 210 is formed by patterning a resist layer and implanting a p-type dopant within exposed areas of the EPI layer 206. The PDRIFT region 210 provides a drain drift region for the high voltage PLDMOS transistor 200. The PDRIFT region 210 is formed by a PDRIFT ion implant with one or more dopants of a first conductivity type (p-type in this example) to create the PDRIFT region 210. In one example, the PDRIFT ion implant may implanting boron with an energy in a range between about 10 keV and about 200 keV, at a dose in a range between about $1 \times 10^{12}$ cm$^{-2}$ and about $5 \times 10^{13}$ cm$^{-2}$ at a tilt angle in a range between about 0 degrees and 7 degrees. Indium may also be implanted with an energy in a range between about 40 keV and about 150 keV, at a dose in a range between about $1 \times 10^{12}$ cm$^{-2}$ and $2 \times 10^{3}$ cm$^{-2}$ at a tilt angle in a range between about 0 degrees and about 7 degrees.

Referring to step 108, a gate stack is formed on the EPI layer 206. A gate dielectric layer 212 is first formed in a high temperature furnace operation or a rapid thermal process. The gate dielectric layer 212 thickness may be any value, with a lower limit of approximately three nanometers for silicon dioxide, with a dielectric constant of about 3.9, or slightly thinner for silicon oxynitride (SiON) due to the latter's higher dielectric constant. The gate dielectric layer 212 thickness is less than a thickness of the field relief dielectric layer 208. After deposition of the gate dielectric layer 212, a suitable CVD precursor is used to deposit a gate electrode layer for a gate electrode 214. Polycrystalline silicon is one example of a material for the gate electrode 214. After the gate dielectric layer 212 and gate electrode layer are formed, a photolithographic pattern step and plasma etch process are used to define the gate electrode 214. Alternatively, a metal gate, fully silicided (FUSI) gate, or CMOS-based replacement gate electrode process may also be used to provide the gate electrode 214. The gate dielectric layer 212 and the gate electrode 214 extend partway over the PDRIFT region 210 in the illustrated example.

In a step 109, an optional NWELL 217 is formed using a suitably patterned implant mask. The NWELL 217 may be formed such that a portion of the p-type EPI layer 206 touches the gate dielectric layer 212 between the PDRIFT region 210 and the NWELL 217. The NWELL 217, if present, may have a depth into the EPI layer 206 similar to the PDRIFT region 210, or may extend as far as the NBL 204. Techniques for forming a well region similar to the NWELL 217 are well known. In one example, arsenic may be implanted with a dose of about $7.0 \times 10^{11}$ cm$^{-2}$ at about 40 keV, followed by implanting phosphorus with a dose of about $4.0 \times 10^{12}$ cm$^{-2}$ at about 260 keV, followed by implanting phosphorus with a dose of about $2.5 \times 10^{13}$ cm$^{-2}$ at about 390 keV.

Referring to step 110, a photoresist layer is patterned to define an opening in a DNWELL ion implant mask corresponding to a DNWELL region 216. In the illustrated example the opening overlies the gate electrode 214 and gate dielectric 212. The exposed edge of the gate electrode 214 delineates one edge of a first post-gate DNWELL ion implant including a second conductivity type (n-type in this example) dopant into a body region of the EPI layer 206 to form a DNWELL region 216. In step 110, the DNWELL ion implant may include two or more implants of the second conductivity type (n-type) DNWELL ion implants at different energies. In one example, the DNWELL ion implant may include a phosphorus implant with an energy of 25 keV to 100 keV, at a dose in a range between about $5 \times 10^{12}$ cm$^{-2}$ and about $1 \times 10^{14}$ cm$^{-2}$ with a tilt angle in a range between about 2 degrees and 30 degrees. The phosphorus implant may be used in combination with an arsenic implant with an energy in a range between about 30 keV and 100 keV, at a dose in a range between about $2 \times 10^{12}$ cm$^{-2}$ and about $2 \times 10^{14}$ cm$^{-2}$ with a tilt angle in a range between about 2 degrees and about 30 degrees. In this example the DNWELL ion implants are self-aligned to the exposed edge of the gate electrode 214, which may be advantageous in achieving a short effective channel length, Leff. The DNWELL region 216 provides a body of the high voltage PLDMOS transistor 200. The gate dielectric layer 212 and the gate electrode 214 extend partway over the DNWELL region 216.

The inventors have recognized that as device geometries shrink (scale), out-diffusion of dopant from the DNWELL 216 over the life of the device 200 and similar devices may lead to early device failure, reduction of safe operating area (SOA), or other unacceptable changes of device operating characteristics. Moreover, as the transistor is scaled, a parasitic bipolar transistor formed by the DNWELL 216 and NWELL 217 operating as the base, the source region 224 operating as the emitter and the epi layer 206 operating as the collector may be more easily switched on, possibly producing a low-resistance path that may damage the device. While a greater dopant concentration in the DNWELL 216 may suppress the parasitic bipolar transistor by reducing its β, such greater dopant concentration may increase the potential for dopant out-diffusion, especially as the device is scaled. The inventors have determined that this heretofore unrecognized device reliability issue may be mitigated by implanting diffusion-reduction species in the DNWELL 216. While similar diffusion-reduction species have been used previously in other devices and contexts, to the inventors' knowledge the present disclosure is the first recognition of utility of this approach as applied to the DNWELL and analogous regions in PLDMOS and NLDMOS transistors. By use of the diffusion-reduction species in the DNWELL 216, for example, the n-type dopant concentration may be doubled or more relative to a similar device lacking the diffusion-reduction species. This increase of dopant concentration has been experimentally determined to suppress activation of the parasitic bipolar transistor, significantly increasing the SOA of the device.

Thus, before the ion implant mask for the DNWELL ion implant is removed from the wafer, a series of diffusion suppression ion implants are made to create a diffusion suppression implant region 218 in the EPI layer 206. The diffusion suppression implant region 218 includes diffusion suppression species that include at least one of carbon, nitrogen, and fluorine, and is at least partially spatially coincident with the DNWELL 216. Without implied limitation, it is believed that the carbon may enable a more abrupt junction between the DNWELL 216 and the EPI layer 206, resulting in lower Rsd. The nitrogen is thought to limit penetration of boron into the gate electrode, resulting in better Ioff and Vt performance. The fluorine is expected to fill interstitials in the semiconductor material of the DNWELL 216, thus limiting boron diffusion. The carbon implant may have an energy between 3 keV and 20 keV, a dose between $2 \times 10^{13}$ cm$^{-2}$ to $1 \times 10^{15}$ cm$^{-2}$ and an implant angle between 2 degrees and 45 degrees. The nitrogen implant may have an energy between 5 keV and 30 keV, a dose between $2 \times 10^{13}$ cm$^{-2}$ to $2 \times 10^{15}$ cm$^{-2}$ and an implant angle between 2 degrees and 45 degrees. The fluorine implant may have an energy between 2 keV and 20 keV, a dose between $5 \times 10^{13}$ cm$^{-2}$ to $4 \times 10^{15}$ cm$^{-2}$ and an implant angle between 2 degrees and 45 degrees. The implant parameters disclosed here are presented by way of example and can also be made in multiple steps. The fluorine may be implanted as boron difluoride ($BF_2$) to reduce an implant depth and reduce channeling. The use of one or more of carbon, nitrogen, and fluorine diffusion suppression species is expected to improve the transistor operating characteristics with respect to at least one of Rsd, Ioff, and Vt. In some cases the use of all of carbon, nitrogen, and fluorine may provide especially favorable improvement of these transistor operating characteristics. An amorphizing species, such as indium or germanium, may be implanted before the carbon, nitrogen, and/or fluorine to amorphize the EPI layer 206 at the top surface. Such an implant may advantageously reduce channeling by the carbon, nitrogen, and/or fluorine, resulting in more uniform placement of these species In a step 111, an optional halo (or pocket) implant may be performed, again using the ion implant mask. The halo implant may include one or both of phosphorous and arsenic. The phosphorous may be implanted using a dose in a range between about $1\times10^{13}$ $cm^{-2}$ and $1.5\times10^{14}$ $cm^2$, with an energy in a range between about 30 keV and 60 keV and an implant angle in a range between about 0 degrees and about 45 degrees. The arsenic may be implanted using a dose in a range between about $1\times10^{13}$ $cm^{-2}$ and $1\times10^{14}$ $cm^{-2}$, with an energy in a range between about 50 keV and 100 keV, and an implant angle in a range between about 0 degrees and about 45 degrees. These implant conditions result in a retrograde dopant distribution, e.g. having a peak dopant concentration below the surface of the EPI layer 206. The presence of this dopant distribution is expected to lower surface doping and/or increase carrier mobility in the DNWELL 216. These effects are further expected to reduce the resistance figure of merit (FOM) of the transistor by 5-10% relative to an otherwise identical device lacking the halo implant.

Referring to step 112, a DWELL may be added. The DWELL is formed by a DWELL ion implant that includes boron and arsenic, followed by a thermal drive, producing a deep, lightly doped p-type well and a shallow, p-type well 220 shown in FIG. 2. The DWELL is optional for the high voltage PLDMOS transistor 200. The shallow p-type well 220 of the DWELL may provide a channel limit region for the high voltage PLDMOS transistor 200, defining a boundary between a channel region and a source extension. The DWELL ion implant and the UNWELL 216 ion implant may be performed in either order. An arsenic implant with an energy between 4 keV and 30 keV, a dose between $4\times10^{14}$ $cm^{-2}$ to $1.2\times10^{15}$ $cm^{-2}$ and an implant angle between 0 degrees and 15 degrees may be used to form the shallow p-type well 220 of the DWELL, by way of example.

Referring to step 114, sidewall spacers 222 of the semiconductor device 201 are then formed on the gate electrode 214. In a series of steps not specifically shown, the sidewall spacers 222 are formed by depositing a silicon oxide layer and a silicon nitride layer over the entire wafer surface. After the deposition of the silicon oxide layer and silicon nitride layer, an anisotropic plasma etch process is used to remove the silicon oxide layer and silicon nitride layer from horizontal areas of the wafer surface, leaving the wafer silicon oxide layer and silicon nitride layer on vertical areas to provide the sidewall spacers 222. In one example, a silicon nitride layer may be deposited across the surface of the wafer and etched to form nitride only sidewall spacers 222 on the gate electrode 214.

Referring to step 116, after the sidewall spacers 222 formation, a heavily doped source region 224 and a heavily doped drain region 226 are formed by ion implantation. To form the source region 224 and drain region 226, a series of patterning steps and ion implantation steps are used to implant the source region 224 in the DNWELL region 216, and the drain region 226 in the PDRIFT region 210. The source region 224 ion implant conditions may include one or more of $BF_2$ or boron as the source implant species. $BF_2$ may be implanted with an energy in a range between about 5 keV and about 25 keV, a dose in a range between about $1\times10^{15}$ $cm^{-2}$ and about $3\times10^{15}$ $cm^{-2}$ and an implant angle in a range between about 2 degrees and about 30 degrees, Boron may be implanted with an energy in a range between about 2 keV and about 20 keV, a dose in a range between $1\times10^{15}$ $cm^{-2}$ and about $3\times10^{15}$ $cm^{-2}$ and an implant angle in a range between about 2 degrees and about 30 degrees. A backgate/body region 225 is also implanted which shorts the to the source region 224 through the silicide 228. The backgate/body region 225 can be formed within the DNWELL region 216 by adding a source/drain implant used for the CMOS section of the process flow which is heavily doped. The drain region 226 implant conditions may include a boron implant with an energy in a range between about 3 keV and about 10 keV, a dose in a range between about $1\times10^{15}$ $cm^{-2}$ and about $3\times10^{15}$ $cm^{-2}$ and an implant angle of about zero degrees. The drain region 226 makes use of the edge of the sidewall spacers 222 to self-align drain region. The drain region 226 contains an average dopant density at least twice that of the PDRIFT region 210.

After the source region 224 and drain region 226 formation, step 118 includes formation of a metal silicide layer 228 which is formed on exposed silicon and polysilicon regions, the deposition of a pre-metal dielectric etch stop layer 230, the deposition of a pre-metal dielectric (PMD) 232, formation of contacts 234, and the formation of metal interconnects 236 which complete the high voltage PLDMOS transistor 200. The metal silicide layer 228 is formed by the deposition of a layer of a metal such titanium or nickel by way of example which is heated to form a metal silicide layer 228 in areas where the metal contacts the EPI layer 206. After the silicide formation step, the unreacted metal is removed via a wet etch process leaving the metal silicide layer 228 in exposed silicon and polysilicon regions. The pre-metal dielectric etch stop layer 230 is generally a silicon nitride or silicon oxynitride layer which may be deposited via a CVD process. The PMD layer 232 may be a CVD deposited oxide which may be doped with phosphorous or phosphorous and boron, the dopants serving as a getter for mobile ions. Contacts 234 are formed using a pattern and etch process to form contact holes to the underlying layers, the contact holes generally being filled with a metal such as tungsten. Metal interconnects 236 are formed after contact 234 formation.

Figure 3:
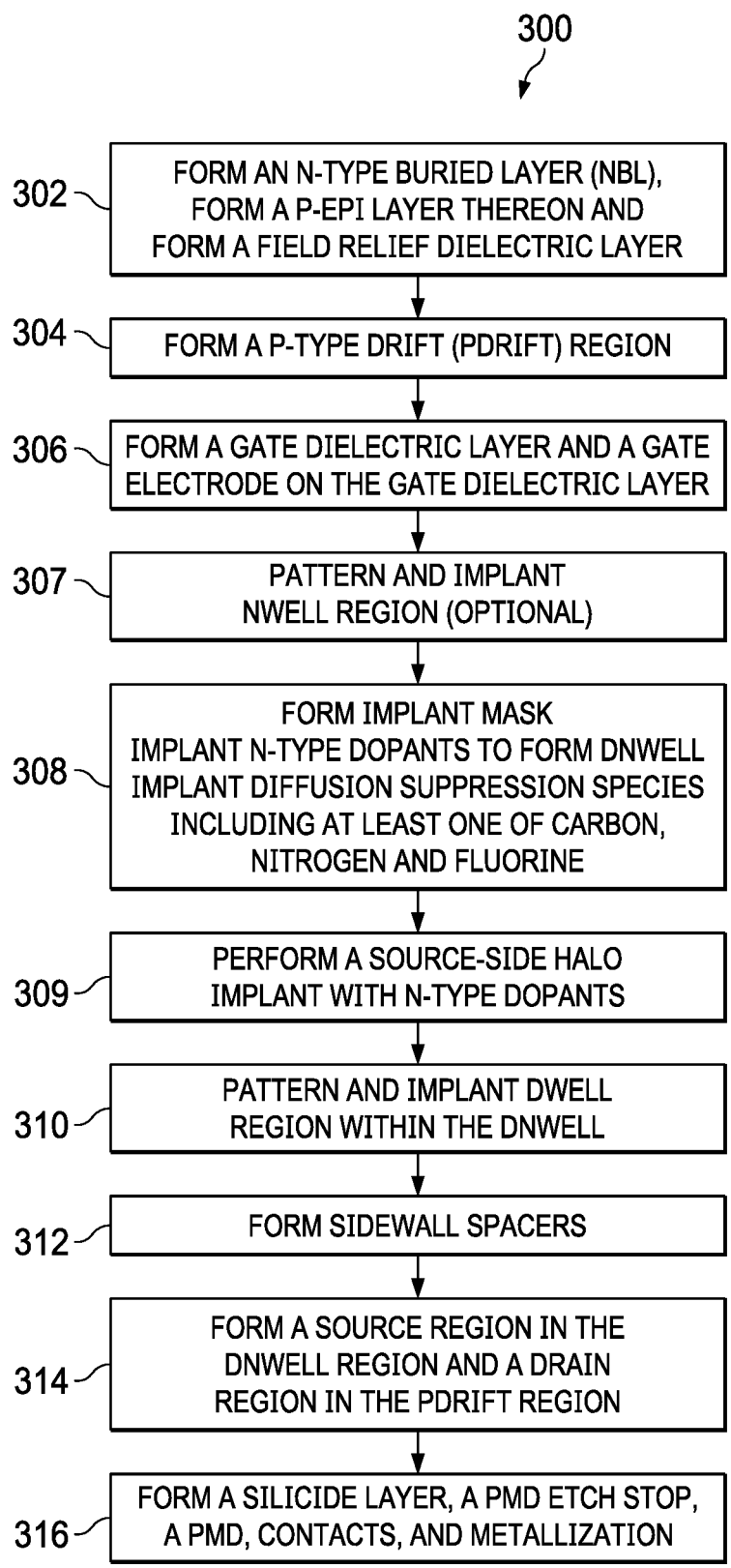
FIG. 3 is an example method of forming a low voltage PLDMOS transistor.
Figure 4:
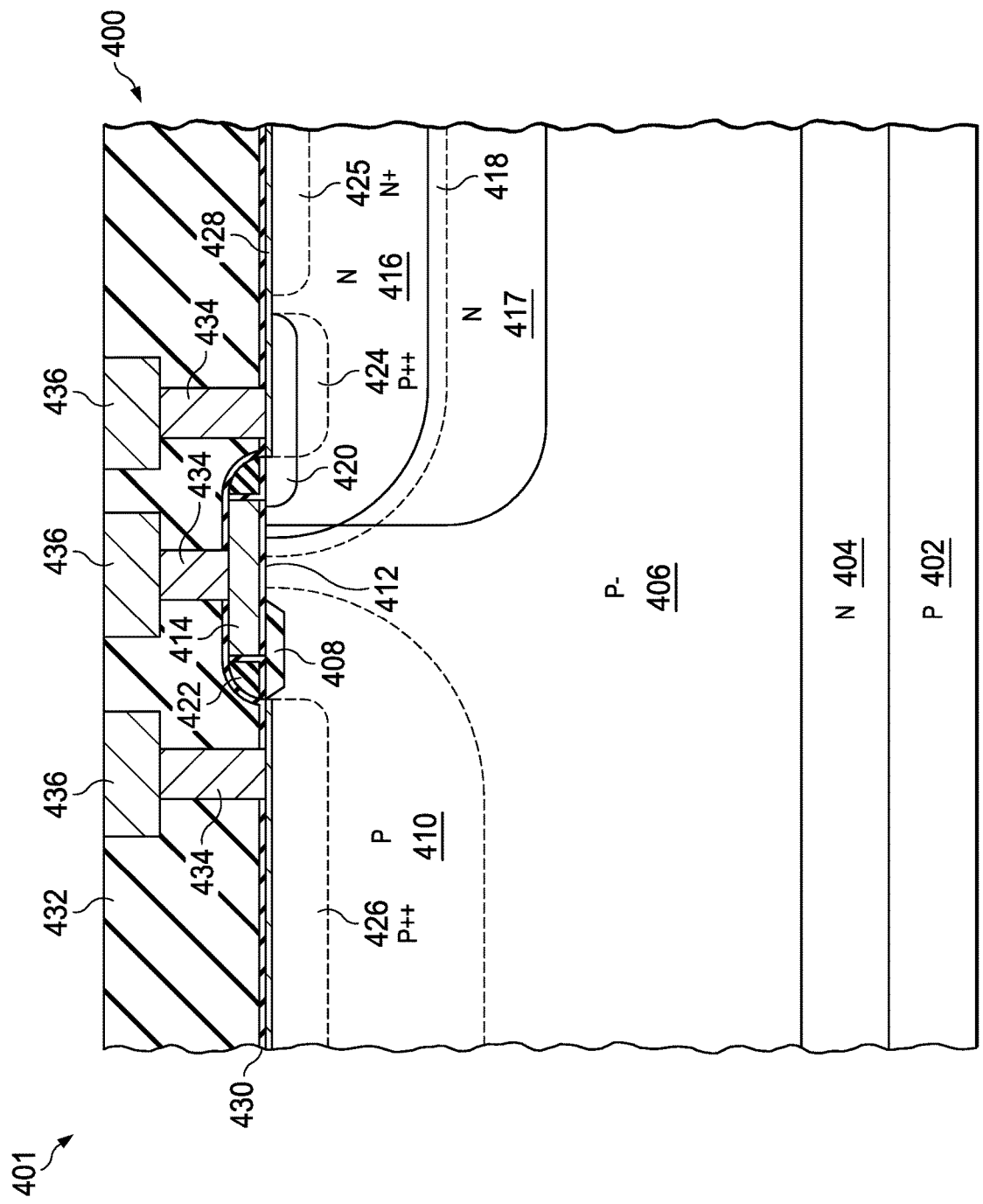
FIG. 4 is a cross section of a low voltage PLDMOS transistor such as produced by the method of FIG. 3.

The principles set forth with respect to the high voltage PLDMOS transistor 200 may be advantageously applied to the formation of similar electronic devices, such as a low voltage PLDMOS transistor. FIG. 3 is a flow chart that shows some steps in an example method 300 of forming a low voltage PLDMOS transistor. FIG. 4 is a cross-sectional diagram showing the example of the low voltage PLDMOS transistor 400 of a semiconductor device 401.

Step 302 includes providing a substrate 402 having an EPI layer 406 of a semiconductor material thereon. The EPI layer 406 may be about 15 microns to 40 microns thick by way of example. The process may include forming a first EPI layer on the substrate, forming an NBL 404, and then forming a second EPI layer 406 over the NBL 404. The substrate 402 is generally a p-type substrate, typically boron doped from $1\times10^{16}$ to $1\times10^{19}$ $cm^{-3}$, and the EPI layer 406 may have a doping level from $3\times10^{14}$ $cm^{-3}$ to $3\times10^{16}$ $cm^{-3}$.

The substrate 402 and the EPI layer 406 may both include silicon, and may also include other materials. Thus, the substrate 402, the NBL 404, and the EPI layer 406 may have the properties disclosed in reference to FIG. 1 and FIG. 2.

Disclosed drain extended transistors may include an isolation structure (not specifically shown). The isolation structure may have any of the configurations disclosed in reference to FIG. 1 and FIG. 2.

Step 302 also includes forming a field relief dielectric layer 408. In a series of steps not specifically shown, a pad oxide layer of silicon dioxide may be formed on the EPI layer 406 surface, by a thermal oxidation process or a CVD process. The pad oxide layer provides stress relief between the EPI layer 406 and subsequent layers. The pad oxide layer may be five nanometers to 50 nanometers thick, by way of example. The field relief dielectric layer 408 may be formed using a LOCOS process, an STI process, or a dual gate oxide process, by way of example.

In step 304 a region is patterned and implanted with a first conductivity type (p-type in this example) to form a PDRIFT region 410 within the exposed pattern areas of the EPI layer 406. The PDRIFT region 410 provides a drain drift region for the low voltage PLDMOS transistor 400. The PDRIFT region 410 is formed by a PDRIFT ion implant with one or more dopants of the first conductivity type to create a drain drift region. The PDRIFT ion implant may include a boron implant with an energy of 10 keV to 200 keV, a dose between $1\times10^{12}$ cm$^{-2}$ to $5\times10^{13}$ cm$^{-2}$ and a tilt angle between 0 degrees and 7 degrees and an indium implant with an energy of between 40 keV to 150 keV, a dose between $1\times10^{12}$ cm$^{-2}$ to $2\times10^{13}$ cm$^{-2}$ and a tilt angle between 0 degrees and 7 degrees by way of example.

Referring to step 306, a gate dielectric layer 412 is formed, having a thickness may range down to approximately three nanometers for silicon dioxide or a silicon oxynitride gate dielectric layer 412 that is slightly thinner. The gate dielectric layer 412 may be formed as disclosed in reference to FIG. 1 and FIG. 2. The gate dielectric layer 412 thickness is less than a thickness of the field relief dielectric layer 408. After deposition of the gate dielectric layer 412, a gate electrode 414 is formed on the gate dielectric layer 412. The gate electrode 414 may be formed as disclosed in reference to FIG. 1 and FIG. 2. The gate electrode 414 may include polycrystalline silicon, a metal gate, a FUSI gate, or CMOS-based replacement gate electrode. The gate dielectric layer 412 and the gate electrode 414 extend partway over the PDRIFT region 410.

In a step 307, an optional NWELL 417 is formed using a suitably patterned implant mask. The NWELL 417 may be formed such that a portion of the p-type EPI layer 406 touches the gate dielectric layer 412 between the PDRIFT region 410 and the NWELL 417. The NWELL 417, if present, may have a depth into the EPI layer 406 similar to the PDRIFT region 410, or may extend as far as the NBL 404. Techniques for forming a well region similar to the NWELL 417 are well known. In one example, arsenic may be implanted with a dose of about $7.0\times10^{11}$ cm$^{-2}$ at about 40 keV, followed by implanting phosphorus with a dose of about $4.0\times10^{12}$ cm$^{-2}$ at about 260 keV, followed by implanting phosphorus with a dose of about $2.5\times10^{13}$ cm$^{-2}$ at about 390 keV.

Referring to step 308, a photolithographic pattern step is made to define an opening in an ion implant mask where one edge of the gate electrode 414 is within the opening and delineates one edge of a first post gate deep well (DNWELL) ion implant. The DNWELL ion implant includes a second conductivity type (n-type in this example) dopant. The second conductivity type dopant is implanted into the body region of the EPI layer 406 to form a DNWELL region 416. In step 308, the DNWELL ion implant may include two or more n-type DNWELL ion implants at different energies, as disclosed in reference to FIG. 1 and FIG. 2. The DNWELL ion implant is self-aligned to at least one edge of the gate electrode 414 which is advantageous in achieving a short Leff. The DNWELL region 416 provides a body of the low voltage PLDMOS transistor 400. The gate dielectric layer 412 and the gate electrode 414 extend partway over the DNWELL region 416.

Before the ion implant mask for the DNWELL ion implant is removed from the wafer a series of diffusion suppression implants are made to create a diffusion suppression implant region 418 in the EPI layer 406, located adjacent to the gate electrode 414 opposite from the PDRIFT region 210. The diffusion suppression implant region 418 includes carbon, nitrogen, and fluorine. The carbon, nitrogen, and fluorine may provide the advantages to Rsd, Ioff, and Vt disclosed in reference to FIG. 1 and FIG. 2. The carbon, nitrogen, and fluorine may be implanted with the implant parameters disclosed reference to FIG. 1 and FIG. 2. An amorphizing species, such as indium or germanium, may be implanted before the carbon, nitrogen, and/or fluorine to amorphize the EPI layer 406 at the top surface. Such an implant may advantageously reduce channeling by the carbon, nitrogen, and/or fluorine resulting in more uniform placement of these species.

In a step 109, an optional halo (or pocket) implant may be performed, again using the ion implant mask. The halo implant may include one or both of phosphorous and arsenic. The halo implant may formed as disclosed reference to FIG. 1 and FIG. 2. Referring to step 310, a DWELL may be added. The DWELL is formed by a DWELL ion implant that includes boron and arsenic, followed by a thermal drive, producing a deep, lightly doped p-type well and a shallow, p-type well 420 shown in FIG. 4. The DWELL is optional for the low voltage PLDMOS transistor 400. The shallow p-type well 420 of the DWELL may provide a channel limit region for the low voltage PLDMOS transistor 400, as disclosed in reference to FIG. 1 and FIG. 2. The DWELL ion implant and the DNWELL ion implant may be made either order. The DWELL ion implant may be made with the implant parameters disclosed reference to FIG. 1 and FIG. 2.

Referring to step 312, sidewall spacers 422 of the semiconductor device 401 are then formed on the gate electrode 414. The sidewall spacers 422 may formed as disclosed reference to FIG. 1 and FIG. 2.

Referring to step 314, after the formation of sidewall spacers 422, a source region 424 and a drain region 226 are formed by ion implantation. The source region 424 and the drain region 426 may formed as disclosed reference to FIG. 1 and FIG. 2. A backgate/body region 425 is also implanted which shorts the to the source region 424 through the silicide 428. The backgate/body 425 region can be formed within the DWELL region 418 by adding a source/drain implant used for the CMOS section of the process flow which is very heavily doped.

After the source region 424 and drain region 426 formation, step 316 includes the formation of a metal silicide layer 428 which is formed on exposed silicon and polysilicon regions, the deposition of a pre-metal dielectric etch stop layer 430, the deposition of a PMD layer 432, formation of contacts 434, and formation of metal interconnects 436 which complete the low voltage PLDMOS transistor 400. The metal silicide layer 428, the pre-metal dielectric etch stop layer 430, the PMD layer 432, the contacts 434, and the metal interconnects 436 may formed as disclosed reference to FIG. 1 and FIG. 2.

While various embodiments of the present disclosure have been described above, it should be understood that they have been presented by way of example only and not limitation. Numerous changes to the disclosed embodiments may be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device including a drain extended metal oxide semiconductor field effect transistor (MOSFET), comprising:
    a source region and a drain region each having a first conductivity type spaced apart along a surface of a semiconductor material having the first conductivity type and a top surface;
    a gate electrode over the top surface of the semiconductor material between the source region and the drain region;
    a body region having an opposite second conductivity type extending from the source region toward the drain region under the gate electrode;
    a drift region having the first conductivity type extending from the body region toward the drain region; and
    a diffusion suppression implant region overlapping the body region, the diffusion suppression implant region comprising at least one of carbon, nitrogen, and fluorine, the drain region and the drift region being free of carbon, nitrogen and fluorine.

2. The semiconductor device of claim 1, wherein the diffusion suppression implant region includes at least one of indium and germanium.

3. The semiconductor device of claim 1, wherein the diffusion suppression implant region includes carbon and nitrogen.

4. The semiconductor device of claim 1, wherein the first conductivity type is p-type and the second conductivity type is n-type.

5. The semiconductor device of claim 4, wherein the body region includes a shallow n-type well that extends front the source region into the body region.

6. The semiconductor device of claim 1, wherein the first conductivity type is n-type and the second conductivity type is p-type.

7. The semiconductor device of claim 1, wherein the drain region has a first dopant concentration and the drift region has a second drain region having a second dopant concentration no greater than ½ the first dopant concentration.

8. The semiconductor device of claim 1, further comprising a field relief dielectric layer and a gate dielectric layer between the gate electrode and the surface of the semiconductor material, the gate dielectric layer extending from the field relief dielectric layer toward the source region and overlapping the diffusion suppression implant region.

9. A semiconductor device including a drain-extended metal oxide semiconductor field effect transistor (MOSFET), comprising:
    a source region and a drain region spaced apart in a semiconductor material, each having a first conductivity type;
    a drain drift region extending from the drain region toward the source region and having the first conductivity type; and
    a body region extending from the source region toward the drain drift region and having an opposite second conductivity type, the body region including a diffusion suppression dopant including at least one of implanted carbon and nitrogen and fluorine, and the drain drift region being free of carbon, nitrogen and fluorine.

10. The semiconductor device of claim 9, wherein the body region includes a well region having the second conductivity type, and the diffusion suppression dopant is located within the well region.

11. The semiconductor device of claim 10, wherein the well region is a first well region located within a second well region having the second conductivity type, the second well region extending further into the semiconductor material than the first well region.

12. The semiconductor device of claim 9, wherein the first conductivity type is p-type and the second conductivity type is n-type.

13. The semiconductor device of claim 9, wherein the diffusion suppression dopant includes each of carbon and nitrogen and fluorine.

14. The semiconductor device of claim 9, wherein the body region includes at least one of indium and germanium.

15. The semiconductor device of claim 9, wherein a well region having the first conductivity type overlaps the body region and the source region and extends past the source region toward the drain drift region.

16. The semiconductor device of claim 9, wherein the semiconductor material is a p-type epitaxial layer over a silicon substrate.

17. The semiconductor device of claim 16, further comprising an n-type buried layer between the silicon substrate and the epitaxial layer.

* * * * *